(12) United States Patent
Sato

(10) Patent No.: US 9,865,668 B2
(45) Date of Patent: Jan. 9, 2018

(54) DISPLAY DEVICE WITH TRANSPARENT CAPACITOR

(71) Applicant: Japan Display Inc., Tokyo (JP)

(72) Inventor: Toshihiro Sato, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 15/132,386

(22) Filed: Apr. 19, 2016

(65) Prior Publication Data

US 2016/0315133 A1  Oct. 27, 2016

(30) Foreign Application Priority Data

Apr. 23, 2015  (JP) ................. 2015-088225

(51) Int. Cl.
 *H01L 27/32* (2006.01)
 *G09G 3/3233* (2016.01)
 *H01L 51/52* (2006.01)

(52) U.S. Cl.
 CPC ....... *H01L 27/3265* (2013.01); *G09G 3/3233* (2013.01); *H01L 27/3213* (2013.01); *H01L 27/3246* (2013.01); *H01L 51/5234* (2013.01); *G09G 2300/0426* (2013.01); *G09G 2300/0439* (2013.01); *G09G 2300/0452* (2013.01); *G09G 2300/0465* (2013.01)

(58) Field of Classification Search
 CPC .................. H01L 27/3246; H01L 27/3265
 See application file for complete search history.

(56) References Cited

U.S. PATENT DOCUMENTS

| | | |
|---|---|---|
| 6,115,088 A | 9/2000 | Zhang |
| 2013/0153893 A1* | 6/2013 | Morosawa .......... H01L 27/1225 257/43 |
| 2013/0207099 A1 | 8/2013 | Shu et al. |
| 2014/0062294 A1 | 3/2014 | Toyoda et al. |
| 2014/0225815 A1 | 8/2014 | Jung et al. |
| 2015/0028298 A1 | 1/2015 | Chung et al. |

(Continued)

FOREIGN PATENT DOCUMENTS

| | | |
|---|---|---|
| CN | 103247657 A | 8/2013 |
| JP | H06-148684 A | 5/1994 |
| JP | H06-258669 A | 9/1994 |

(Continued)

OTHER PUBLICATIONS

Taiwanese Office Action dated Feb. 3, 2017, for corresponding Taiwanese Application No. 105111390.

(Continued)

*Primary Examiner* — Daniel Luke
(74) *Attorney, Agent, or Firm* — Typha IP LLC

(57) ABSTRACT

A display device is provided including a plurality of pixels, wherein the plurality of pixels is arranged in a matrix form, wherein each of the plurality of pixels has an emission region and a transparent region, and wherein the emission region has a light-emitting element, and the transparent region has at least a part of a storage capacitor having transparency and is covered with at least one electrode of the storage capacitor, a first electrode covers the plurality of pixels, a light-emitting layer is arranged below the first electrode, a second electrode is arranged below the light-emitting layer, and the storage capacitor includes the first electrode.

9 Claims, 19 Drawing Sheets

(56) References Cited

U.S. PATENT DOCUMENTS

2015/0115261 A1\* 4/2015 Kimura .............. H01L 27/1225
257/43
2015/0144910 A1\* 5/2015 Beak .................... H01L 27/124
257/40

FOREIGN PATENT DOCUMENTS

| JP | 1998-078593 A | 3/1998 |
|----|---------------|--------|
| JP | H10-078593 A  | 3/1998 |
| JP | 2014-049313 A | 3/2014 |
| TW | 201432652 A   | 8/2014 |
| TW | 201505159 A   | 2/2015 |

OTHER PUBLICATIONS

Korean Office Action dated Jul. 12, 2017, for corresponding KR Patent Application No. 10-2016-0046353, with partial English translation.

\* cited by examiner

DISPLAY DEVICE WITH TRANSPARENT CAPACITOR

CROSS REFERENCE TO RELATED APPLICATIONS

This application is based upon and claims the benefit of priority from the prior Japanese Patent Application No. 2015-88225, filed on Apr. 23, 2015, the entire contents of which are incorporated herein by reference.

FIELD

The present invention is related to a display device. In particular, the present invention is related to the structure of a pixel in a display region of a display device.

BACKGROUND

An organic electroluminescence (referred to herein as organic EL) display device is arranged with a light-emitting element in each pixel and displays an image by individually controlling the light emission. A light-emitting element includes a structure in which a layer (referred to herein as [light-emitting layer]) including an organic EL material is sandwiched between a pair of electrodes regarded as an anode electrode and cathode electrode. The organic EL display device is arranged with one electrode as a pixel electrode in each pixel, and the other electrode as a common electrode which extends over a plurality of pixels and is applied with a common voltage. The organic EL display device controls light emission from a pixel by applying the voltage of the pixel electrode to each pixel with respect to the voltage of the common electrode.

In recent years, a so-called transparent display is known in which the scene at the rear of a display region can be viewed through the display region. As a transparent display, a structure is known as is disclosed in Japanese Laid Open Patent No. 2014-049313 for example in which an emission region arranged with a light-emitting element which carries out image display, and a transparent region which includes a so-called see through structure is arranged separately to the emission region in each of a plurality of pixels arranged in a matrix form in a display region.

Generally, a plurality of thin film transistors or capacitors are arranged in a driving circuit of a light-emitting pixel which carries out image display and a fine layout design is required given the progress in high definition. However, in a transparent display including the structure described above, further limitations in the area taken up by an emission region are produced in order to secure a transparent region in each of a plurality of pixels and it becomes difficult to secure a sufficient area for arranging a storage capacitor in an emission region. When the size of a storage capacitor can not be sufficiently secured, the display device is easily affected by a variation in the characteristics of a thin film transistor and high image quality becomes difficult to achieve. That is, miniaturization of a pixel for high definition and high image quality of a display device are in a trade-off relationship.

On the other hand, with respect to a self light-emitting type organic EL display device, in a liquid crystal display device which displays an image by control of light from a backlight, a structure of a pixel for easily obtaining a high definition and/or high image quality display device by forming an auxiliary capacitor using a transparent electrode used in a liquid crystal element is known as is disclosed in Japanese Laid Open Patent No. H6-148684, Japanese Laid Open Patent No. H6-258669 and Japanese Laid Open Patent No. H10-78593 for example.

In consideration of the problems described above, the present invention aims to provide a structure of a new pixel using structural elements unique to a self light-emitting type display device which can achieve both high definition and high image quality even in a transparent display.

SUMMARY

One aspect of the present invention is a display device including a plurality of pixels, wherein the plurality of pixels is arranged in a matrix form, wherein each of the plurality of pixels has an emission region and a transparent region, and wherein the emission region has a light-emitting element, and the transparent region has at least a part of a storage capacitor having transparency and is covered with at least one of the electrode of the storage capacitor.

One aspect of the present invention is a manufacturing method of a display device including forming a light-emitting element on an emission region and at least a part of a storage capacitor on a transparent region, wherein the emission region and the transparent region are disposed on each of a plurality of pixels disposed in a matrix form on a first surface of a substrate, and wherein at least one of the electrodes of the storage capacitor covers the transparent region.

DESCRIPTION OF THE EMBODIMENTS

The embodiments of the present invention are explained below while referring to the diagrams. However, it is possible to perform the present invention using various different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols are attached to similar elements and elements that have been mentioned in previous drawings, and therefore a detailed explanation may be omitted where appropriate.

In the present specification, in the case where certain parts or regions are given as [above (or below)] other parts or regions, as long as there is no particular limitation, these include parts which are not only directly above (or directly below) other parts or regions but also in an upper direction (or lower direction), that is, other structure elements may be included between other parts or regions in an upper direction (or lower direction).

First Embodiment

Figure 1:
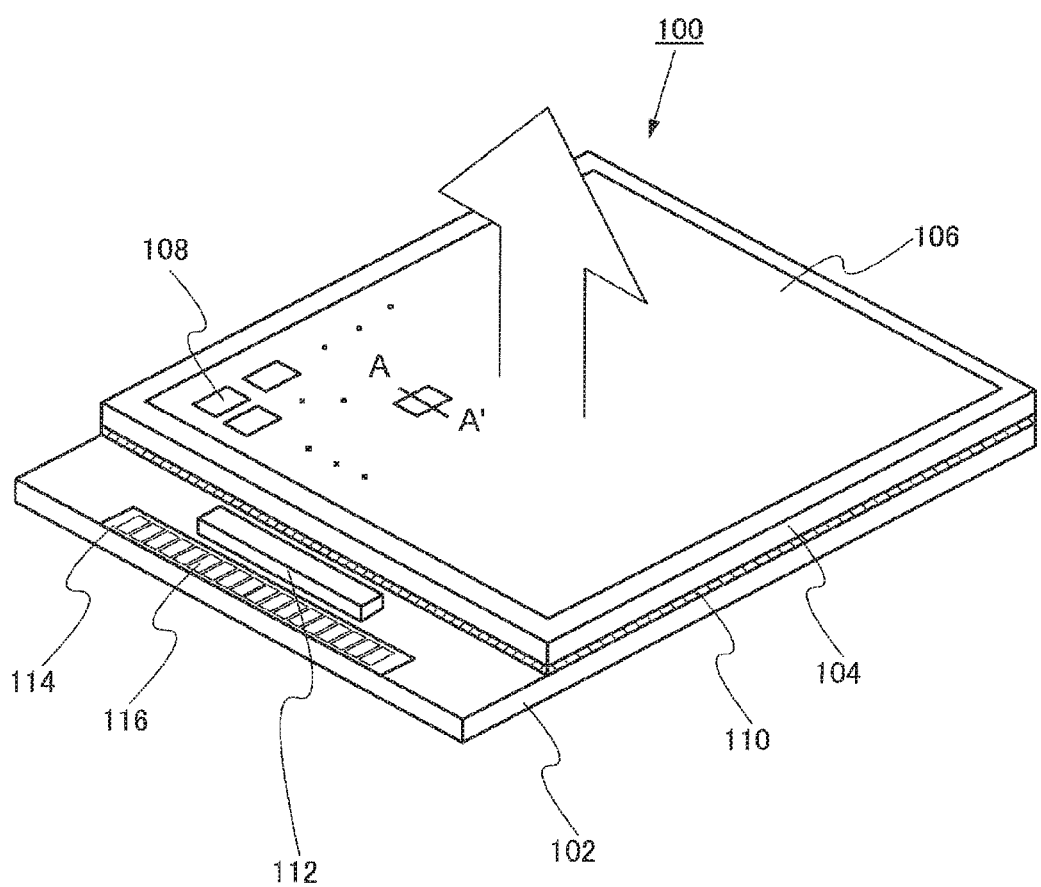
FIG. 1 is a perspective view diagram showing a structure of a display device according to one embodiment of the present invention.

The structure of a display device 100 according to the present embodiment is explained while referring to FIG. 1. FIG. 1 is a perspective view diagram showing the structure of the display device 100 according to the present embodiment. The display device 100 is arranged with a display region 106 in a first substrate 102. The display region 106 is formed by arranging a plurality of pixels 108. A second substrate 104 is arranged on the upper surface of the display region 106 as a sealing component. The second substrate 104 is fixed to the first substrate 102 by a sealing material 110 which encloses the display region 106. The display region 106 formed in the first substrate 102 is sealed so as not be exposed to air by the second substrate 104 which is a sealing component and the sealing material 110. Degradation of a light-emitting element arranged in a pixel 108 is controlled by this sealing structure.

One end part of the first substrate 102 is arranged with a terminal region 114. The terminal region 114 is arranged on the outer side of the second substrate 104. The terminal region 114 is formed by a plurality of connection terminals 116. A wiring substrate which connects devices which output a video signal or power supply and a display panel is arranged in the connection terminal 116. The connection point of the connection terminal 116 which connects with the wiring substrate is exposed to the exterior.

Figure 2:
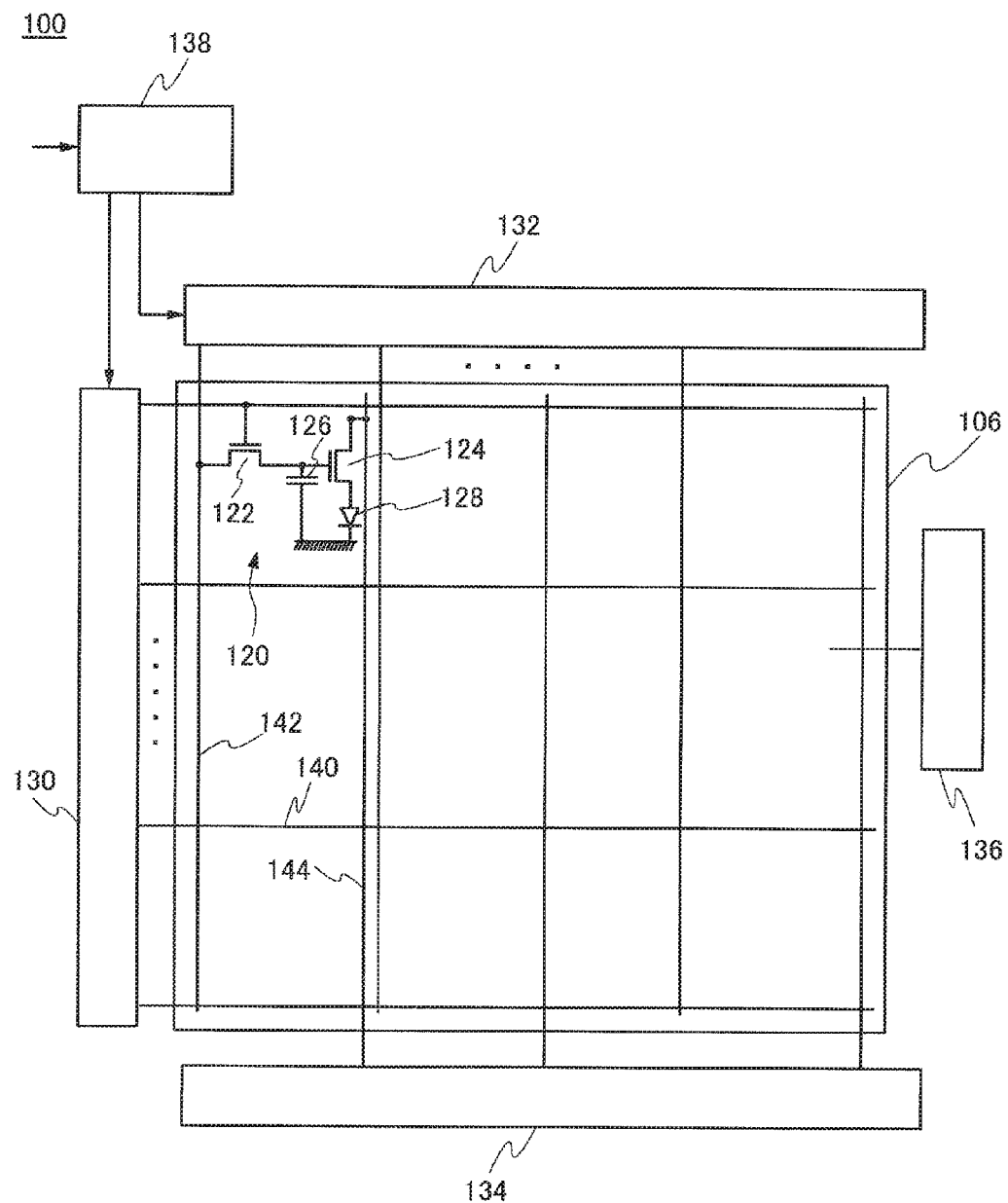
FIG. 2 is a planar view diagram showing a structure of a display device according to one embodiment of the present invention.

Next, a circuit structure of the display device 100 according to the present embodiment is explained while referring to FIG. 2. FIG. 2 is a diagram showing a circuit structure of the display device 100 according to the present embodiment.

The organic EL display device is arranged with the display region 106 which displays an image and a drive part which drives the display region 106. A plurality of pixels 118 is arranged in a matrix form in the display region 106 of the organic EL display device and a pixel circuit 120 is included in each pixel 108. The pixel circuit 120 includes at least a selection transistor 122, a drive transistor 124, a storage capacitor 126 and a light-emitting element 128.

On the other hand, a drive part includes a scanning line drive circuit 130, a video line drive circuit 132, a drive power supply circuit 134, a reference power supply circuit 136 and control device 138, and includes a function for controlling light emitted by the light-emitting element 128 by driving the pixel circuit 120.

The scanning line drive circuit 130 is connected to a scanning signal line 140 arranged along each pixel in a horizontal direction (pixel row). The scanning line drive circuit 130 selects a scanning signal line 140 in sequence according to a timing signal output from the control device 138 and applies a voltage to the selected scanning signal line 140 to switch the selection transistor 122 ON.

The video line drive circuit 132 is connected to a video signal line 142 arranged along each pixel in a vertical direction (pixel column). The video line drive circuit 132 is input with a video signal from the control device 138 and outputs a voltage according to a video signal of a selected pixel row to each video signal line 142 together with a selection of a scanning signal line 140 by the scanning line drive circuit 130. The voltage is written to the storage capacitor 126 via a selection transistor 122 at a selected pixel row. The drive transistor 124 supplies a current according to the written voltage to the light-emitting element 128 and thereby the light-emitting element 128 of a pixel corresponding to the selected scanning signal line 140 emits light.

The drive power supply circuit 134 is connected to a power supply voltage line 144 arranged in each pixel column, and supplies a current to the power supply voltage line 144 and light-emitting element 128 via the drive transistor 124 of a selected pixel row.

The reference power supply circuit 136 is connected to a reference power supply line 145 and provides a fixed voltage to a common electrode which forms a cathode electrode of the light-emitting element 128. The fixed voltage can be set to a ground voltage for example.

In the present embodiment, one of the electrodes of the light-emitting element 128 is a pixel electrode formed in each pixel, the other electrode of the light-emitting element 128 covers a plurality of pixels and is a common electrode arranged in common to a plurality of pixels. A pixel electrode is connected to a drive transistor 124 while a common electrode is formed by an electrode across a plurality of pixels.

Figure 3:
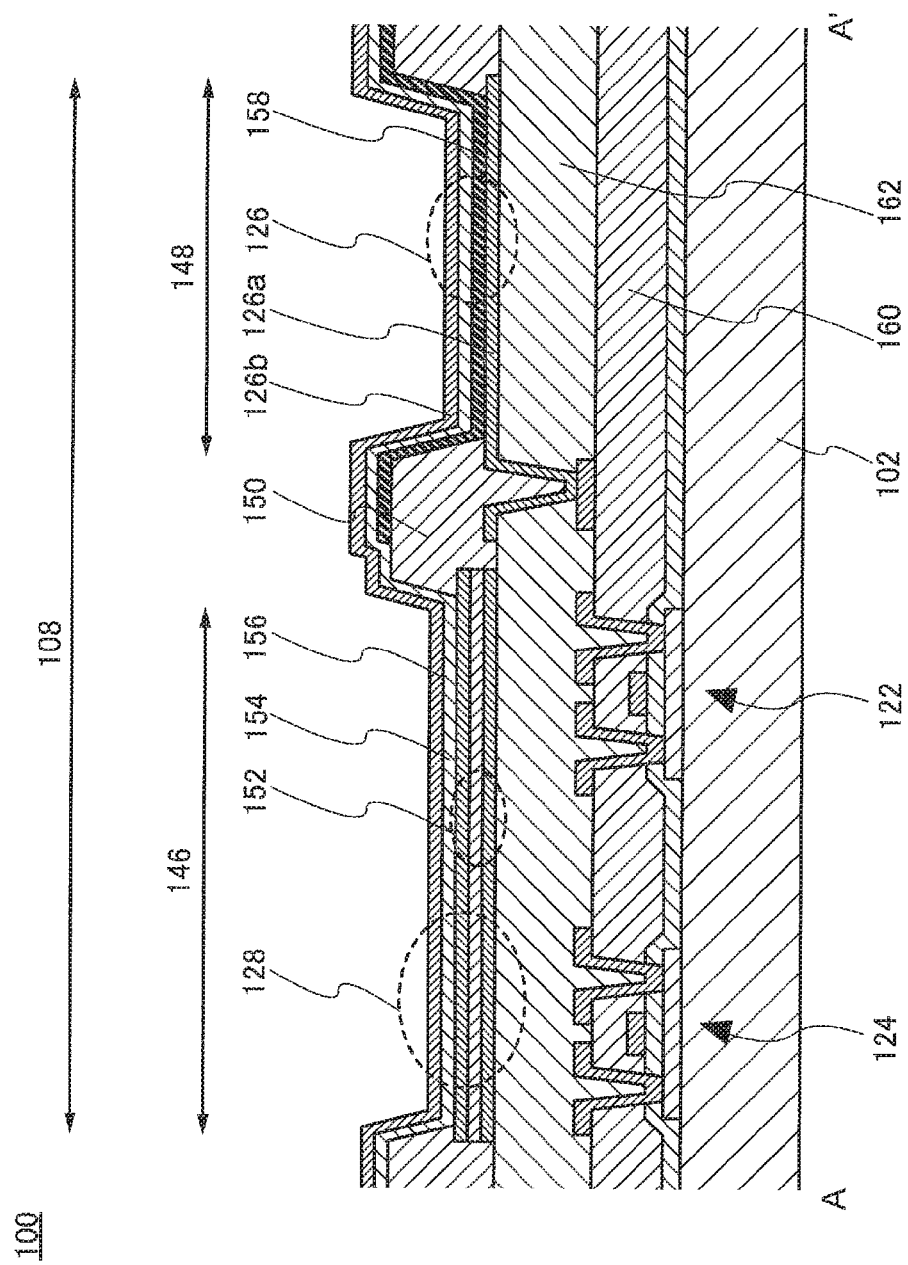
FIG. 3 is a cross-sectional diagram showing a structure of a display device according to one embodiment of the present invention.
Figure 4:
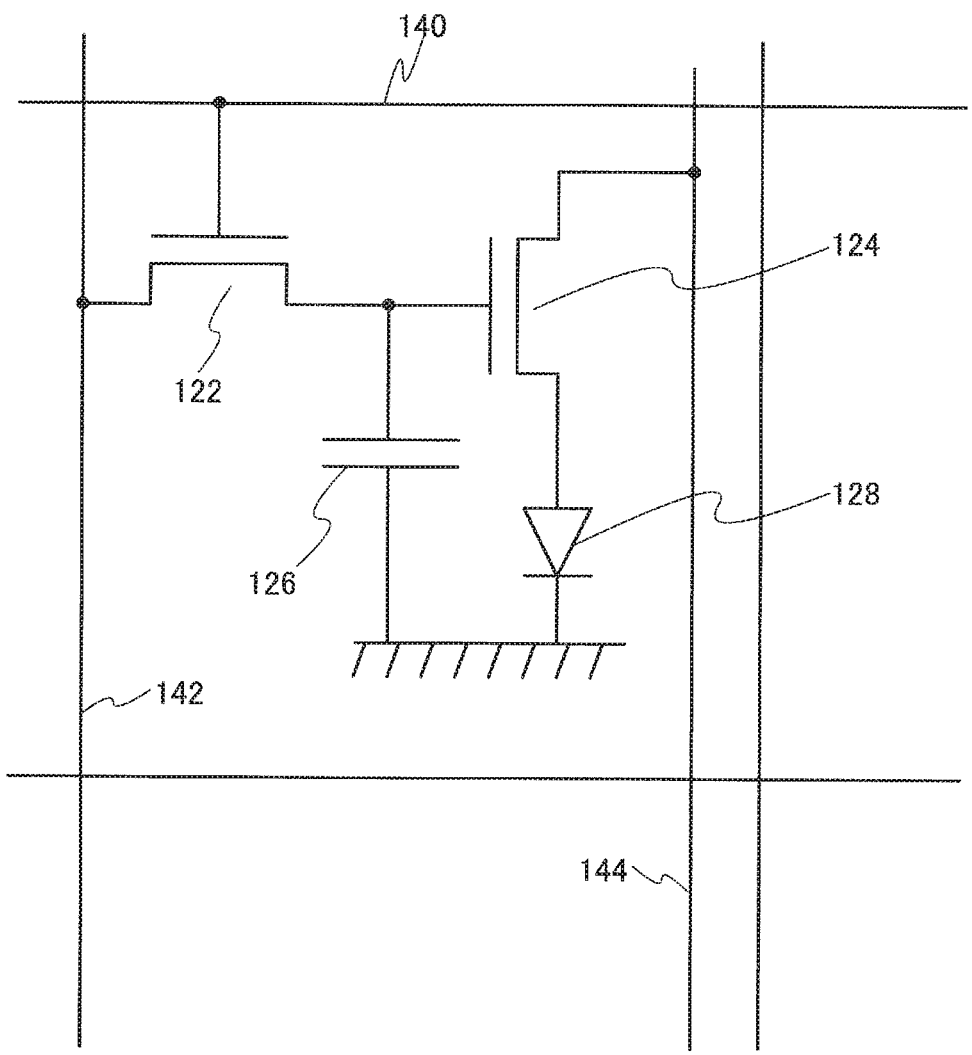
FIG. 4 is a planar view diagram showing a structure of a pixel circuit of a display device according to one embodiment of the present invention.

The structure of the display device 100 according to the present embodiment is explained in further detail while referring to FIG. 3 and FIG. 4. FIG. 3 is a cross-sectional diagram showing the structure of a pixel in the display device 100 according to the present embodiment and shows a cross-section of the first substrate (also called an array substrate) side along the line A-B in FIG. 1. FIG. 4 is a circuit diagram showing a pixel circuit of a pixel in the display device 100 according to the present embodiment.

Each of the plurality of pixels 108 includes an emission region 146 and transparent region 148. A light-emitting element 128 is arranged in the emission region 146 and a storage capacitor 126 is arranged in the transparent region 148. Here, the storage capacitor 126 has transparency.

In this way, since the storage capacitor 126 has transparency, it is possible to arrange the storage capacitor 126 in the transparent region 148. Therefore, it is possible to provide a high definition and high image quality transparent display.

Furthermore, although the storage capacitor 126 extends over the transparent region 148 in the present embodiment, a structure is also possible in which one of the electrodes of the storage capacitor 126 extends over the transparent region 148. The other electrode may cover at least a part of the transparent region 148. By adopting this type of structure, it is possible to further improve transparency of the display device even though transparency of the storage capacitor 126 decreases compared to the display device 100 according to the present embodiment.

In the display device 100 according to the present embodiment, the plurality of pixels are sectionalized into the emission region 146 and transparent region 148. A bank 150, which sectionalizes each of the plurality of pixels into the emission region 146 and transparent region 148, is formed in each of the plurality of pixels.

A selection transistor 122, drive transistor 124 and light-emitting element 128 which form a pixel circuit 120 are formed in the emission region 146. The selection transistor 122 and drive transistor 124 are arranged below the light-emitting element 128.

The light-emitting element 128 has a structure wherein a light-emitting layer 154 is sandwiched by a pixel electrode 152 and common electrode 156. Among the electrodes of the light-emitting element 128, the lower electrode is the pixel electrode 152 and the upper electrode is the common electrode 156. In the present embodiment, the pixel electrode 152 includes a structure formed by three stacked conductive layers. Furthermore, the pixel electrode 152 is electrically connected with the source electrode of the drive transistor 124 via a contact aperture part not shown in the diagram.

In the case where the light-emitting layer 154 contains an organic EL layer for example, a low molecular-weight or a high molecular-weight organic material is used. In the case where a low molecular organic material is used, in addition to the light-emitting layer 154 including an organic material with light-emitting properties, a structure including a hole injection layer or an electron injection layer, or a hole transport layer or an electron transport layer which sandwich the light-emitting layer 154 is available. In the present embodiment, the light-emitting layer 154 uses a component that emits white light and full color display is realized using a color filter (not shown in the diagram). Furthermore, the light-emitting layer 154 may also have a so-called tandem-type structure in which a plurality of light-emitting layers (organic EL layer) overlap.

Since the common electrode 156 allows light emitted by the light-emitting layer 154 to pass through, it is preferred that the common electrode 156 has transparency and is formed from a transparent thin film such as ITO (indium doped with tin oxide) or IZO (Indium zinc oxide) having conductive properties. Alternatively, the common electrode 156 may also be formed using a metal film formed to a thickness that allows light emitted by the light-emitting layer 154 to pass through.

Since light emitted by the light-emitting layer 154 is reflected to the common electrode 156 side from the pixel electrode 152, the pixel electrode 152 is preferred to include a metal layer with high reflectance and in the present embodiment includes a structure in which a metal layer is sandwiched between two transparent conductive layers. It is possible to use silver (Ag) for example as the metal layer. It is preferred that the two transparent conductive layers are formed from a transparent thin film such as ITO (indium doped with tin oxide) or IZO (Indium zinc oxide) having conductive properties or an arbitrary combination of these may also be used.

A storage capacitor 126 extends over the transparent region 148 in the display device 100 according to the present embodiment. The storage capacitor 126 in the present embodiment has a structure in which the light-emitting layer 154 and insulation layer 158 are sandwiched by an upper electrode and lower electrode (referred to as upper electrode 126b and lower electrode 126a respectively).

The common electrode 156 arranged in common with a plurality of pixels arranged in the display region 106 also plays a role of the upper electrode 126b of the storage capacitor 126. In order to provide this type of structure, the upper electrode 126b of the storage capacitor 126 is connected to a reference power supply circuit and is provided with a fixed voltage. A ground voltage for example is set as the fixed voltage.

It is possible to use either of the two transparent conductive layers which form the pixel electrode 152 described previously as the lower electrode 126a of the storage capacitor 126.

A film having transparency is used as the insulation layer 158 and a silicon nitride film for example is preferred. Alternatively, the insulation layer 158 in the present embodiment is arranged across the top of the bank 150 covering the transparent region 148. In other words, the end part of the insulation layer 158 which covers the transparent region 148 is arranged above the bank 150. That is, in the manufacturing process, a material of the insulation layer 158 is formed after the bank 150 is formed and patterning is performed. By adopting this type of layer structure, manufacturing of the display device 100 becomes easy since the alignment accuracy required when patterning the insulation layer 158 is roughed.

As described above, it is possible to use any electrode used uniquely for a self light emitting type light-emitting element as the electrode of the storage capacitor 126 having transparency. That is, in the manufacturing process, because it is possible to form an electrode of the light-emitting element 128 and an electrode of the storage capacitor 126 simultaneously, it is possible to easily provide the display device 100 in the present embodiment at low cost without any significant changes or adding the manufacturing process.

Second Embodiment

Figure 5:
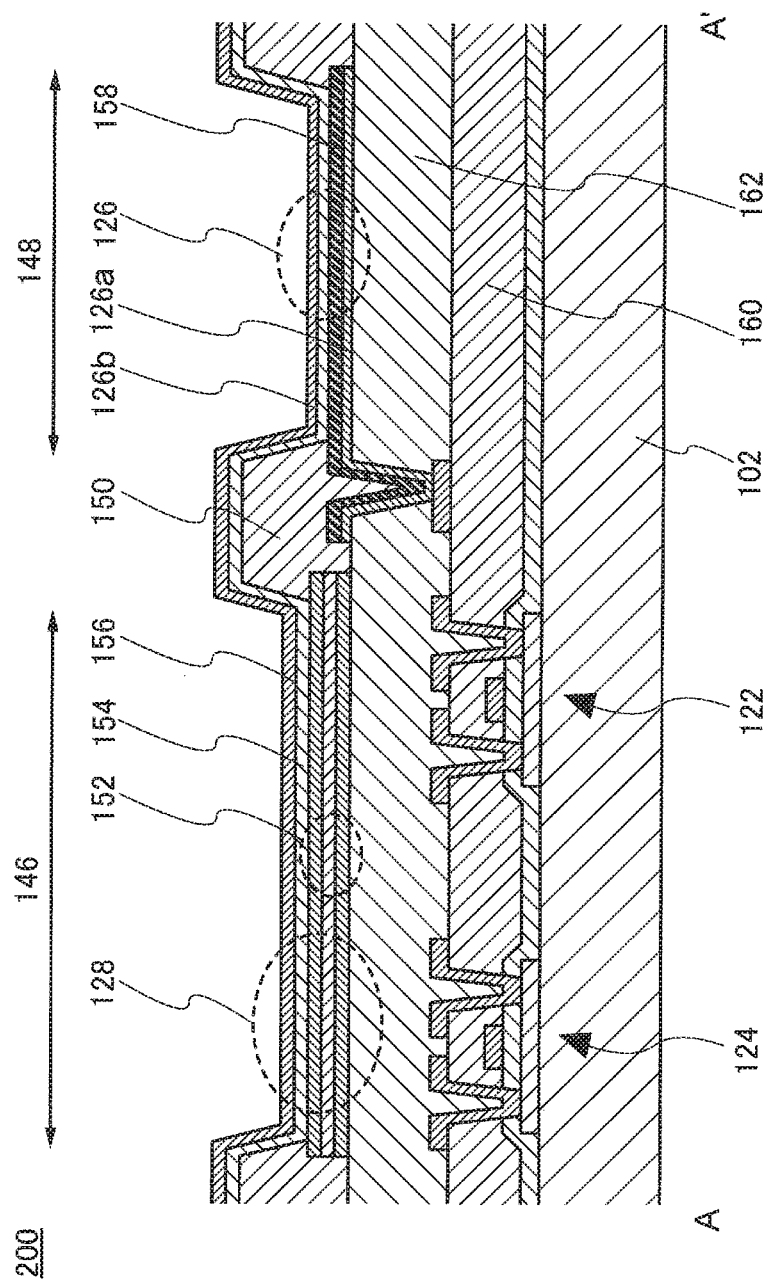
FIG. 5 is a cross-sectional diagram showing a structure of a display device according to one embodiment of the present invention.

The structure of a display device 200 according to the present embodiment is explained in further detail with reference to FIG. 5. FIG. is a cross-sectional diagram showing the structure of a pixel in the display device 200 according to the present embodiment. The structure of the pixel circuit 120 is the same as the pixel circuit 120 of the display device 100 according to the first embodiment shown in FIG. 4.

When the display device 200 according to the present embodiment is compared with the display device 100 according to the first embodiment, only the layer structure of the insulation layer 158 and bank 150 of the storage capacitor 126 arranged in the transparent region 148 is different.

In the present embodiment, the insulation layer 158 is arranged across the bottom of the bank 150. In other words, the bank 150 is formed so as to cover an end part of the insulation layer 158 covering the transparent region 148. That is, in the manufacturing process, a material of the insulation layer 158 is deposited and patterned before the bank is formed. By adopting this type of layer structure, it is possible to perform batch patterning together with the lower electrode 126a of the storage capacitor 126 when patterning the insulation layer 158. Therefore, since there is no increase in a mask due to the arrangement of the transparent region 148, it is possible to easily provide the display device 200 at low cost.

Third Embodiment

Figure 6:
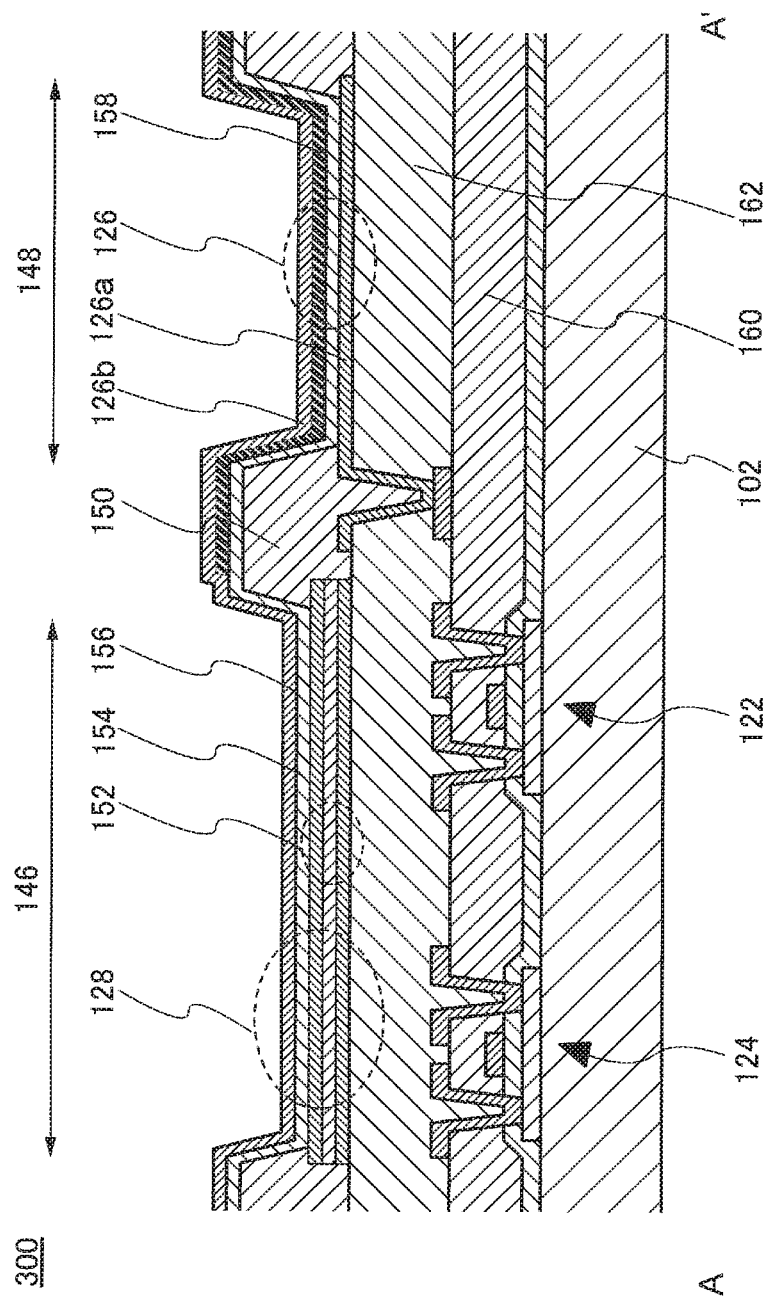
FIG. 6 is a cross-sectional diagram showing a structure of a display device according to one embodiment of the present invention.

The structure of a display device 300 according to the present embodiment is explained in detail with reference to FIG. 6, FIG. 6 is a cross-sectional diagram showing the structure of a pixel in the display device 300 according to the present embodiment. The structure of the pixel circuit 120 is the same as the pixel circuit 120 of the display device 100 according to the first embodiment shown in FIG. 4.

When the display device 300 according to the present embodiment is compared with the display device 100 according to the first embodiment or display device 200 according to the second embodiment, only the layer structure of the insulation layer 158 of the storage capacitor 126 arranged in the transparent region 148 is different.

In the present embodiment, the insulation layer 158 covering the transparent region 148 is arranged above the light-emitting layer 154. An end part of the insulation layer 158 is arranged above the bank 150. That is, in the manufacturing process, a material of the insulation layer 158 is deposited and patterned after the light-emitting layer 154 covering a plurality of pixels arranged in the display region 106 is formed. By adopting this type of layer structure, the storage capacitor 126 is easily formed since the alignment accuracy required when patterning the insulation layer 158 is roughed. Furthermore, in the first embodiment, a process for depositing a material of the insulation layer 158 is carried out before formation of the light-emitting layer 154. In this way, a structure is formed whereby the insulation layer 158 is arranged below the light-emitting layer 154. In this case, because the insulation layer 158 is formed after formation of the bank 150 in the previous process, it is possible to easily perform mask alignment with a high degree of accuracy. In addition, it is also possible to reduce damage to the light-emitting layer 154.

Fourth Embodiment

Figure 7:
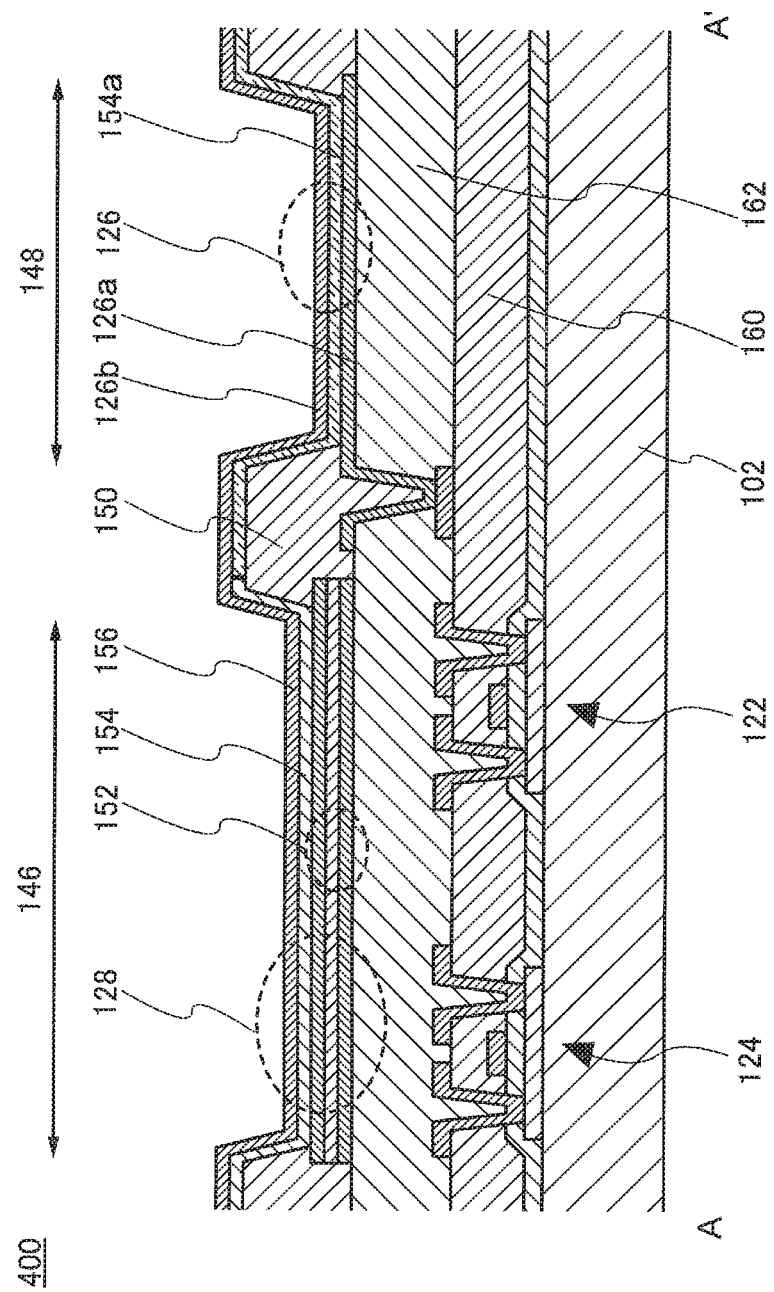
FIG. 7 is a cross-sectional diagram showing a structure of a display device according to one embodiment of the present invention.

The structure of a display device 400 according to the present embodiment is explained in detail with reference to FIG. 7, FIG. 7 is a cross-sectional diagram showing the structure of a pixel in the display device 400 according to the present embodiment. The structure of the pixel circuit 120 is the same as the pixel circuit 120 of the display device 100 according to the first embodiment shown in FIG. 4.

When the display device 400 according to the present embodiment is compared with the display device 100 according to the first embodiment to the display device 300 according to the third embodiment, only the layer structure of an insulation layer 154a of the storage capacitor 126 arranged in the transparent region 148 is different.

In the present embodiment, the storage capacitor 126 is formed in the transparent region 148 by changing the property of the regions other than the emission region 146 in the light-emitting layer 154 covering a plurality of pixels. The property of the regions other than the emission region 146 in the light-emitting layer 154 is changed to insulation property. It is possible to form the light-emitting layer 154 into an insulation layer by irradiating an appropriate energy to the light-emitting layer 154 for example. It is possible to use ultraviolet rays for example as the energy.

As a specific manufacturing method, a metal film which forms the pixel electrode 152 of the light-emitting element 128 is used as a light blocking layer and energy is irradiated from the surface side on which a transistor of the substrate 102 is not arranged after forming the light-emitting layer 154. In this way, energy is irradiated to regions other than the region arranged the light-emitting element 128 and it is possible to form insulation layer of those regions in self-alignment manner. That is, it is possible to form the insulation layer 158 for forming the storage capacitor 126 and form the storage capacitor 126 without requiring a patterning process and without increasing the number of required masks. Therefore, it is possible to easily provide the display device 400 in the present embodiment at low cost without any significant changes or adding the manufacturing process.

Fifth Embodiment

Figure 8:
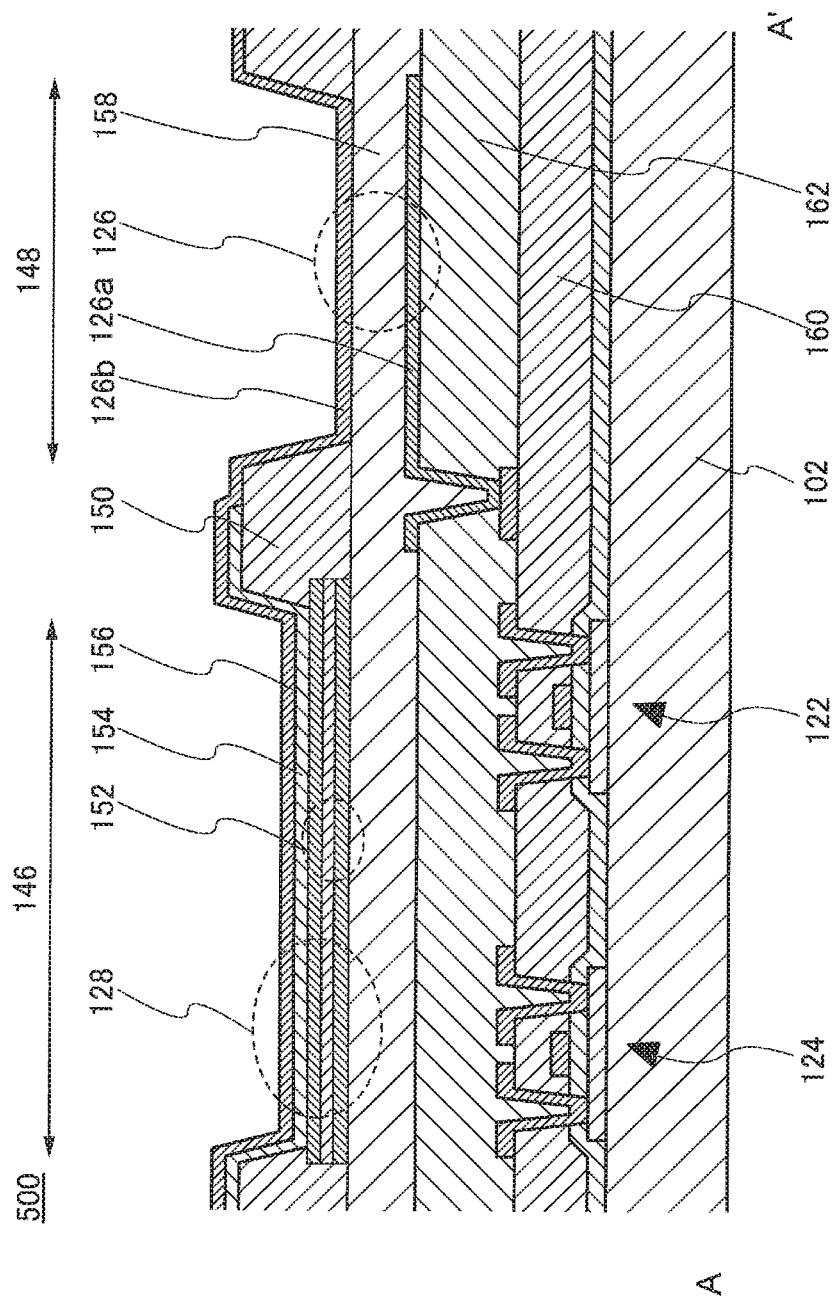
FIG. 8 is a cross-sectional diagram showing a structure of a display device according to one embodiment of the present invention.

The structure of a display device 500 according to the present embodiment is explained in further detail with reference to FIG. 8. FIG. 8 is a cross-sectional diagram showing the structure of a pixel in the display device 500 according to the present embodiment. The structure of the pixel circuit 120 is the same as the pixel circuit 120 of the display device 100 according to the first embodiment shown in FIG. 4.

When the display device 500 according to the present embodiment is compared with the display device 100 according to the first embodiment to the display device 400 according to the fourth embodiment, only the layer formed with the lower electrode 126a of the storage capacitor 126 is different. That is, the lower electrode 126a of the storage capacitor 126 is arranged in a different layer to the common electrode 152 of the light-emitting element 128.

In order to provide this type of layer structure, in the manufacturing process, the lower electrode 126a of the storage capacitor 126 is formed separately from the process for forming the pixel electrode 152. However, since it is not necessary to leave at least one layer of the transparent conductive layers in the transparent region 148 as an electrode of the storage capacitor 126 when forming the pixel electrode 152, which includes three layers in this example, for providing this type of layer structure, it is possible to perform batch patterning of the pixel electrode 152. Therefore, it is possible to easily provide the display device 500 in the present embodiment at low cost without any significant changes or adding the manufacturing process.

Furthermore, although the light-emitting layer 154 in the present embodiment is shown as covering a plurality of pixels arranged in the display region 106, the present invention is not limited to this structure, and the light-emitting layer 154 may be left only in the emission region 146. In this way, it is possible to improve transparency of the display device 500.

Sixth Embodiment

Figure 9:
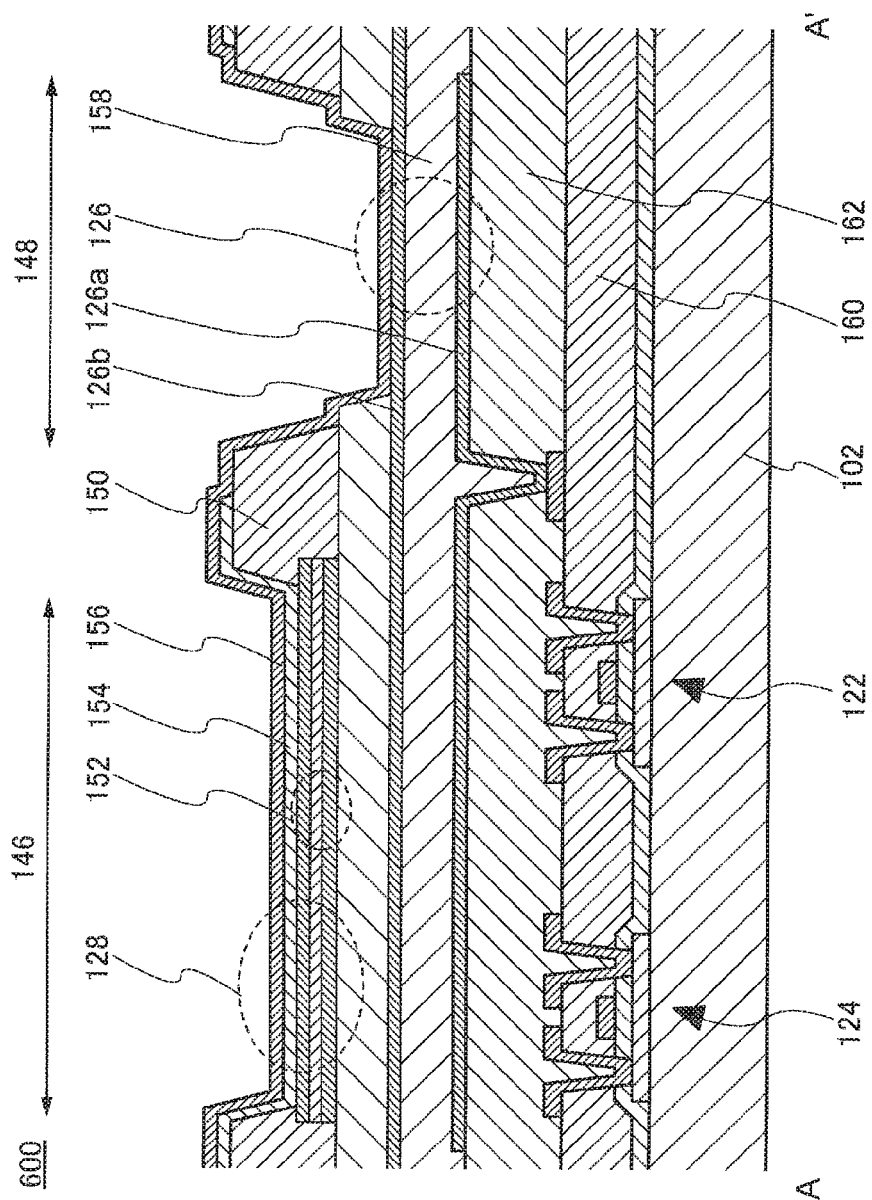
FIG. 9 is a cross-sectional diagram showing a structure of a display device according to one embodiment of the present invention.
Figure 10:
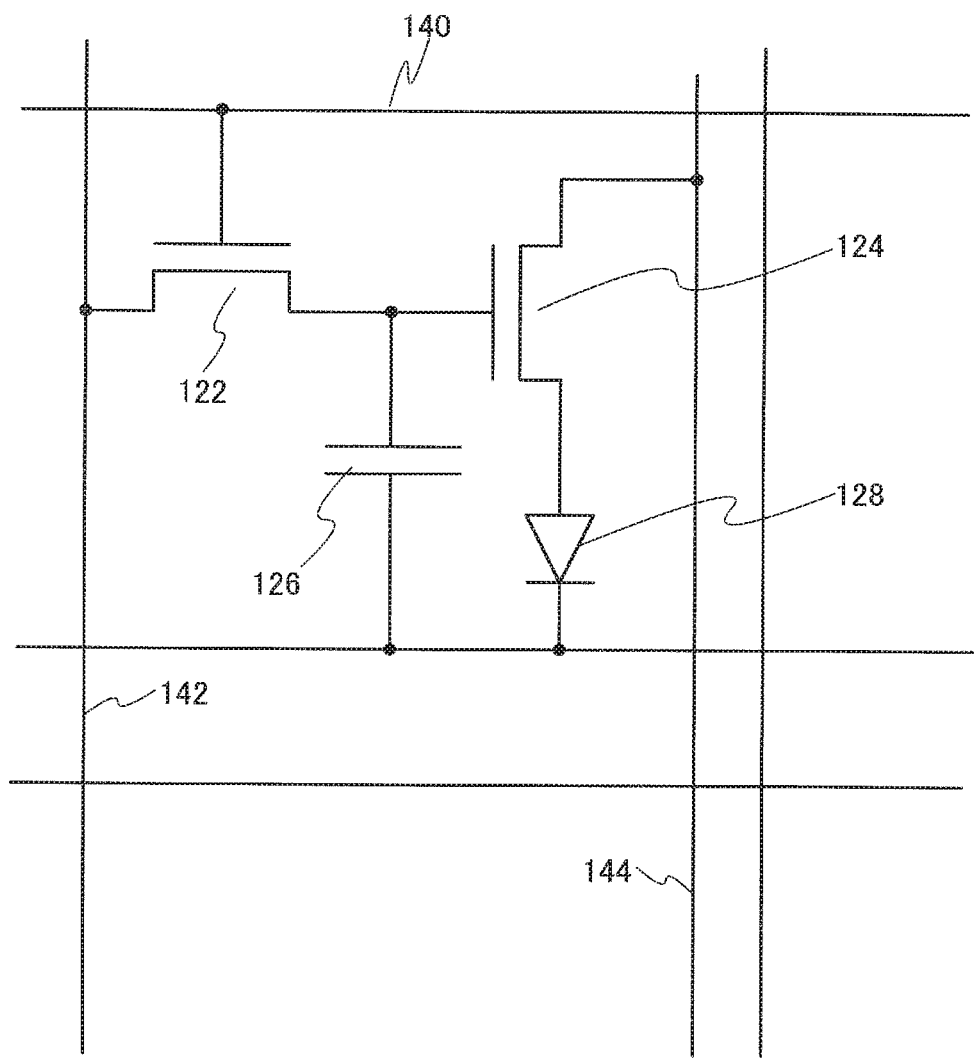
FIG. 10 is a planar view diagram showing a structure of a pixel circuit of a display device according to one embodiment of the present invention.

The structure of a display device 600 according to the present embodiment is explained in further detail with reference to FIG. 9 and FIG. 10. FIG. 9 is a cross-sectional diagram showing a structure of a pixel in the display device 600 according to the present embodiment. FIG. 10 is a circuit diagram showing a pixel structure of a pixel in the display device 600 according to the present embodiment.

The display device 600 according to the present embodiment is different to the display devices according to the first to fifth embodiments in that the storage capacitor 126 is formed on a lower layer than the light-emitting element 128. In addition, among the electrodes of the storage capacitor 126, the upper electrode 126b covers a plurality of pixels arranged in the display region 106 and the lower electrode 126a is arranged for each pixel covering one pixel. That is, in the present embodiment, the storage capacitor 126 covers not only the transparent region 148 but also covers one pixel. In other words, a part of the storage capacitor 126 is formed in the transparent region 148. The upper electrode 126b is connected with the common electrode 156 and is electrically conductive.

Due to this type of structure, it is possible to maximize the area occupied by the storage capacitor 126 and provide a high image quality display device 600.

Furthermore, since the upper electrode 126b of the storage capacitor 126 becomes an auxiliary wire of the common electrode 156 which functions as the cathode of the light-emitting element 128, it is possible to suppress a drop in a reference voltage supplied to the cathode and provide a high image quality display device 600

Seventh Embodiment

Figure 11:
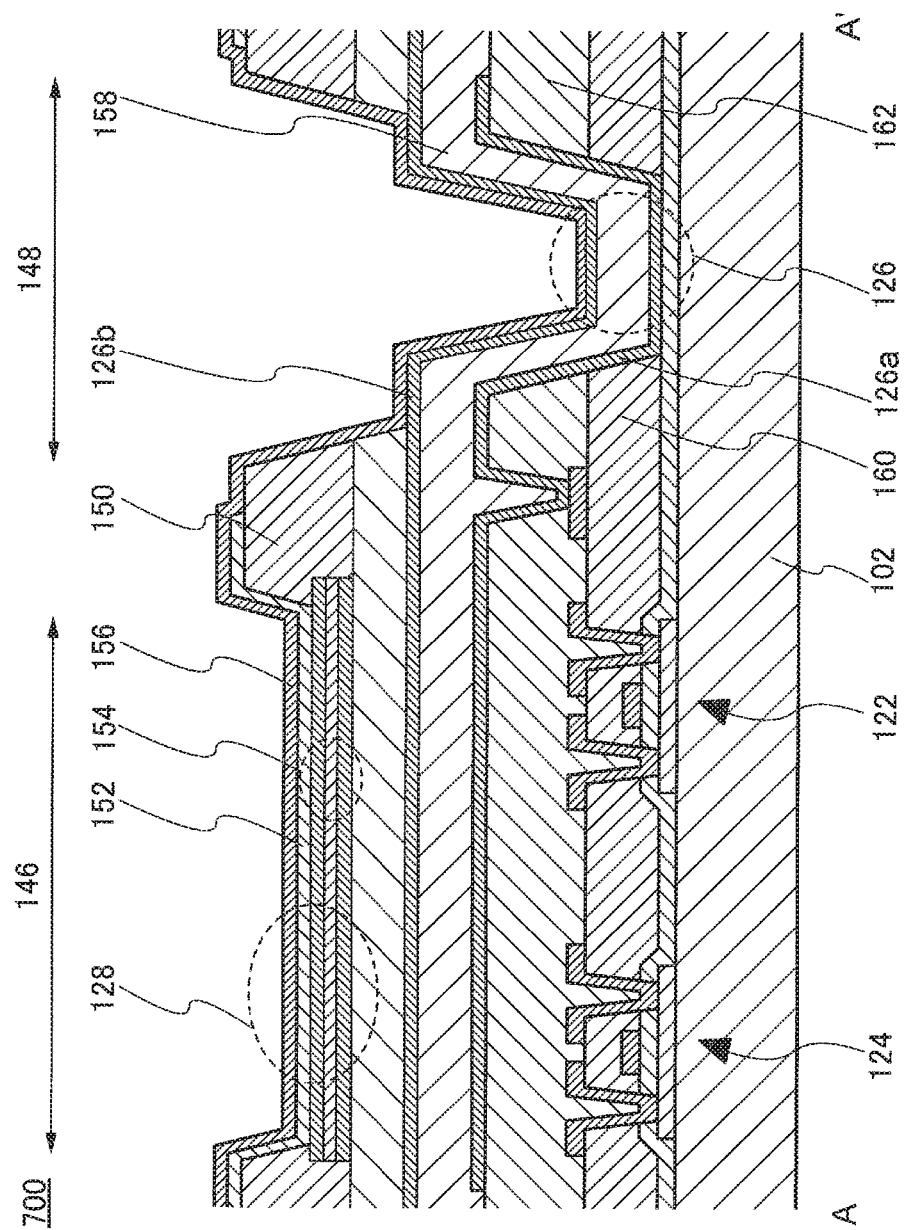
FIG. 11 is a cross-sectional diagram showing a structure of a display device according to one embodiment of the present invention.

The structure of a display device 700 according to the present embodiment is explained in detail with reference to FIG. 11, FIG. 11 is a cross-sectional diagram showing the structure of a pixel in the display device 700 according to the present embodiment. The pixel circuit 120 is the same as the pixel circuit 120 of the display device 600 according to the sixth embodiment shown in FIG. 10.

When the display device 700 according to the present embodiment is compared with the display device 600 according to the sixth embodiment, the different point is that the interlayer insulation film 160 and a planarization film 162 are removed in the transparent region 148.

Due to this type of structure, it is possible to improve transparency compared to the display device according to the sixth embodiment.

In addition, although the insulation layer 160 is arranged on the same layer as the layer formed with the drive transistor 124, the insulation layer 160 is formed in an inorganic insulation film. Since the inorganic insulation film is hard and frail, there is a risk to be broken when the display device is bent in the case where the display device 700 is an inorganic display. By removing the insulation layer 160 in the transparent region 148 as in the present embodiment and providing a shape in which the insulation layer 160 is separated and distributed in an island shape for each pixel seen from a planar view and prevent breakage, it is possible to reduce the risk to the display is broken when the display is bent.

Eighth Embodiment

Figure 12:
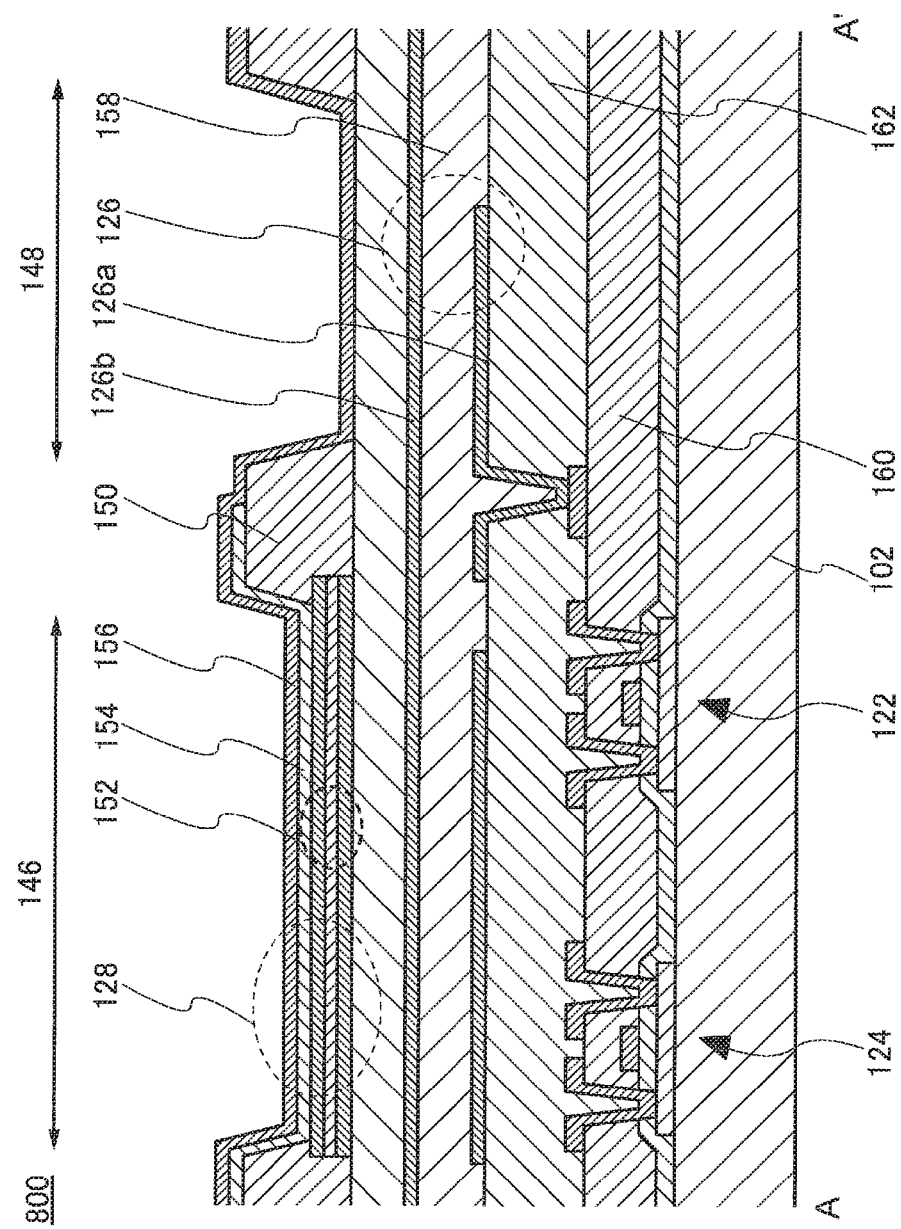
FIG. 12 is a cross-sectional diagram showing a structure of a display device according to one embodiment of the present invention.
Figure 13:
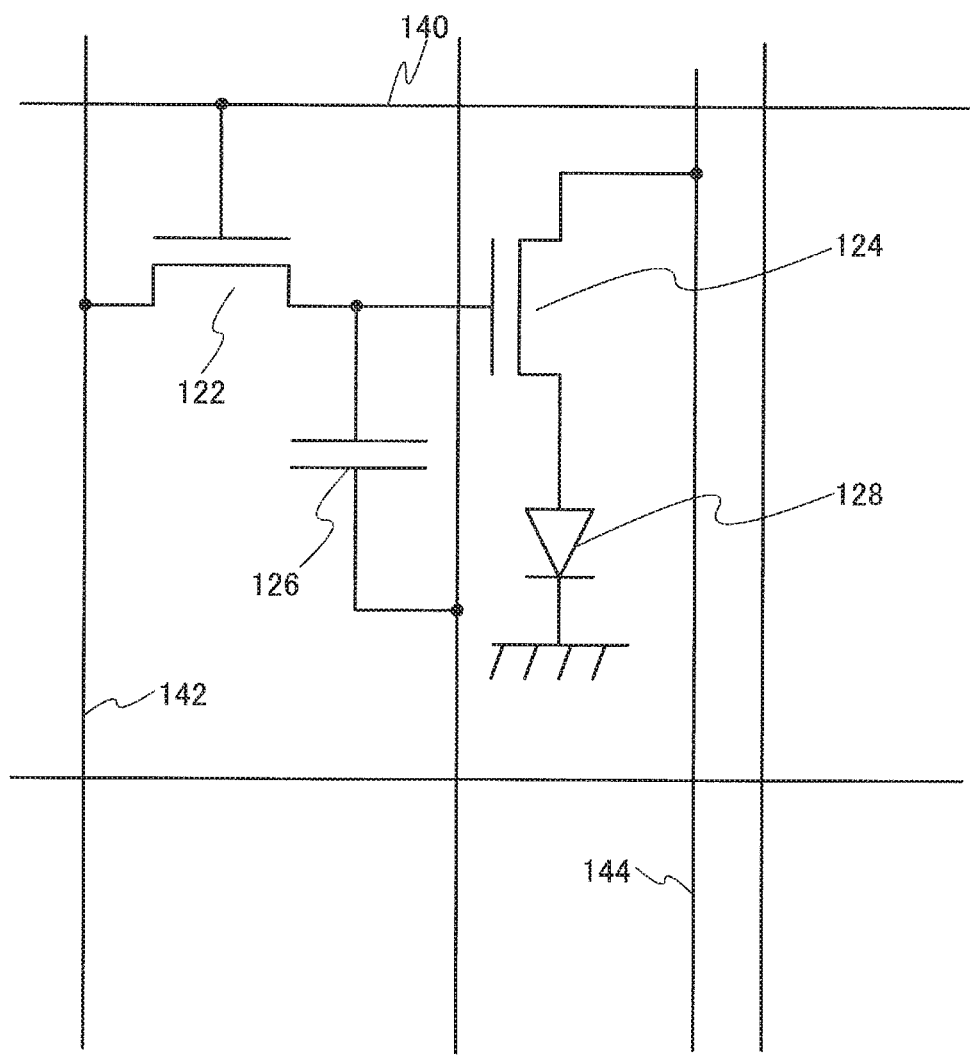
FIG. 13 is a planar view diagram showing a structure of a pixel circuit of a display device according to one embodiment of the present invention.

The structure of a display device 800 according to the present embodiment is explained in detail with reference to FIG. 12 and FIG. 13, FIG. 12 is a cross-sectional diagram showing a structure of a pixel in the display device 800 according to the present embodiment. FIG. 13 is a circuit diagram showing a pixel structure 120 of a pixel in a display device according to the present embodiment.

In the present embodiment, the storage capacitor 126 is formed below the light-emitting element 128. In other words, the light-emitting element 128 is formed after forming the storage capacitor 126. The upper electrode 126b of the storage capacitor 126 covers the transparent region 148 and covers a plurality of pixels arranged in the display region 106. The lower electrode 126a does not completely cover the transparent region 148 and only covers a part of the transparent region 148. In addition, the lower electrode 126a extends over the emission region 146. That is, a part of the storage capacitor 126 is formed in the transparent region 148.

In addition, as shown in the diagram, a lower electrode may be divided among a plurality of electrically independent regions. Since it is possible to form a plurality of capacitors in this way, it is possible to be applied to a pixel circuit with complex structure.

Due to this type of structure, since it is possible to form the storage capacitor 126 across one pixel at maximum, it is possible to secure a sufficient capacitance of the storage capacitor 126 and provide a high image quality display device 800.

In addition, by providing a structure in which the lower electrode 126a covers only a part of the transparent region 148, it is possible to improve transparency of the display device 800.

Ninth Embodiment

Figure 14:
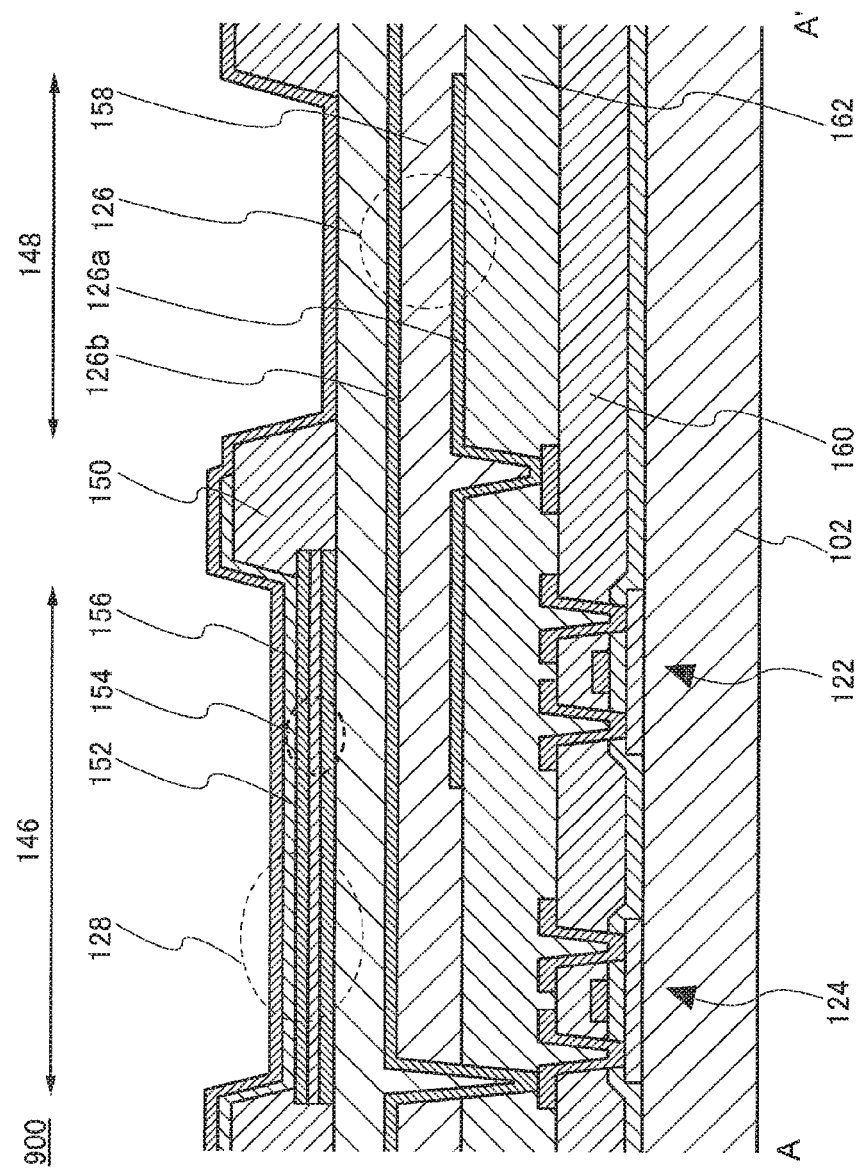
FIG. 14 is a cross-sectional diagram showing a structure of a display device according to one embodiment of the present invention.
Figure 15:
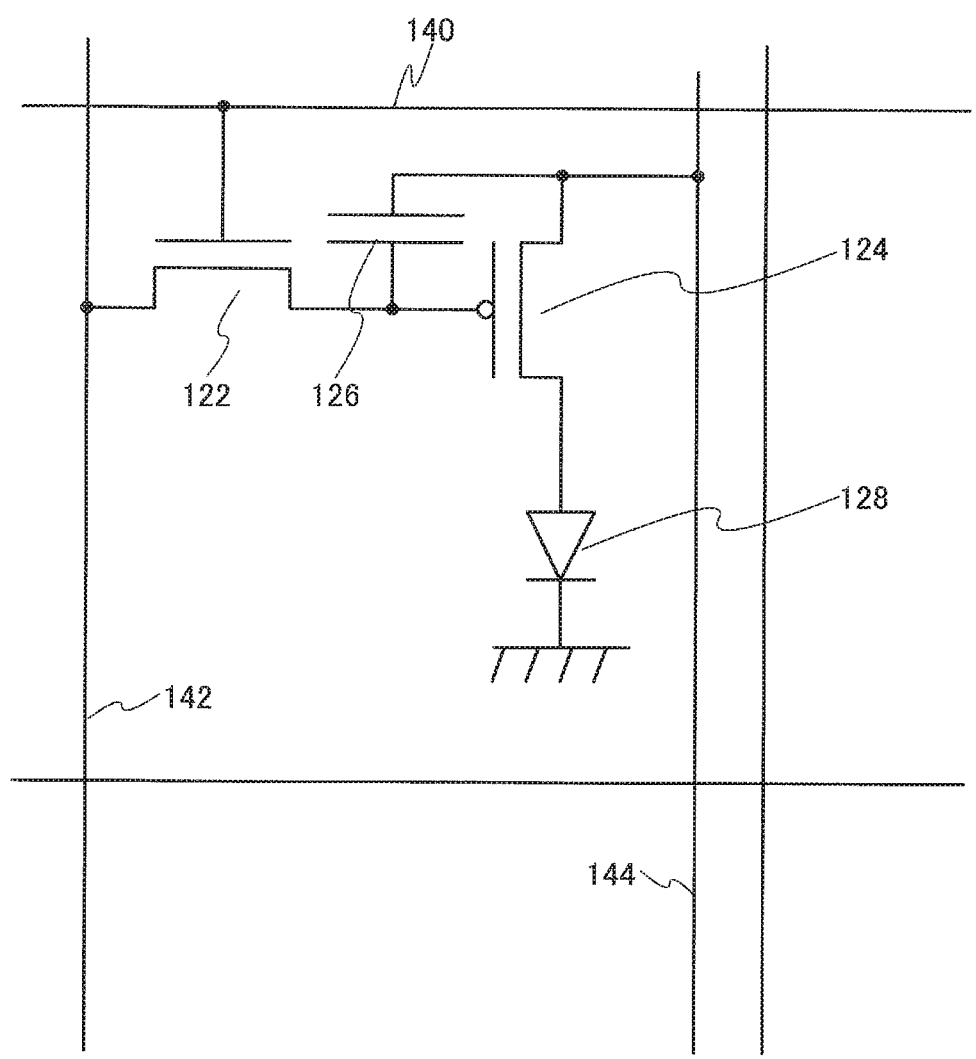
FIG. 15 is a planar view diagram showing a structure of a pixel circuit of a display device according to one embodiment of the present invention.

The structure of a display device 900 according to the present embodiment is explained in detail with reference to FIG. 14. FIG. 14 is a cross-sectional diagram showing a structure of a pixel in the display device 900 according to the present embodiment. FIG. 15 is a circuit diagram showing a pixel structure 120 of a pixel in a display device according to the present embodiment.

When the display device 900 of the present embodiment is compared with the display device 800 according to the eighth embodiment, the different point is that the upper electrode 126b of the storage capacitor 126 is connected with a power supply voltage line 144 which supplies a power supply voltage. That is, the upper electrode 126b of the storage capacitor 126 covers a plurality of pixels arranged in the display region 106 and also serves as the power supply voltage line 144. As a result, a high degree of uniformity is achieved within the display region 106 due to a low resistance power supply voltage line 144 at the time of supplying a Current to the pixel electrode 152 which functions as an anode of the light-emitting element 128. In addition, it is possible to provide a high image quality display device 900.

Furthermore, the pixel electrode 152 which functions as an anode of the light-emitting element 128 is connected to the source electrode of the drive transistor 124. As a result, a contact hole not shown in the diagram is arranged in the upper electrode 126b of the storage capacitor 126 and the pixel electrode 152 and the source electrode of the drive transistor 124 are connected via the contact hole. In this embodiment, the drive transistor 124 is a P type transistor. In this way, since it is possible to apply a voltage together with an accumulated charge of the storage capacitor 126 between the gate electrode and source electrode of the drive transistor 124, control of the amount of current flowing to the light-emitting element 128 becomes easy.

Pixel Arrangement Example 1

Figure 16:
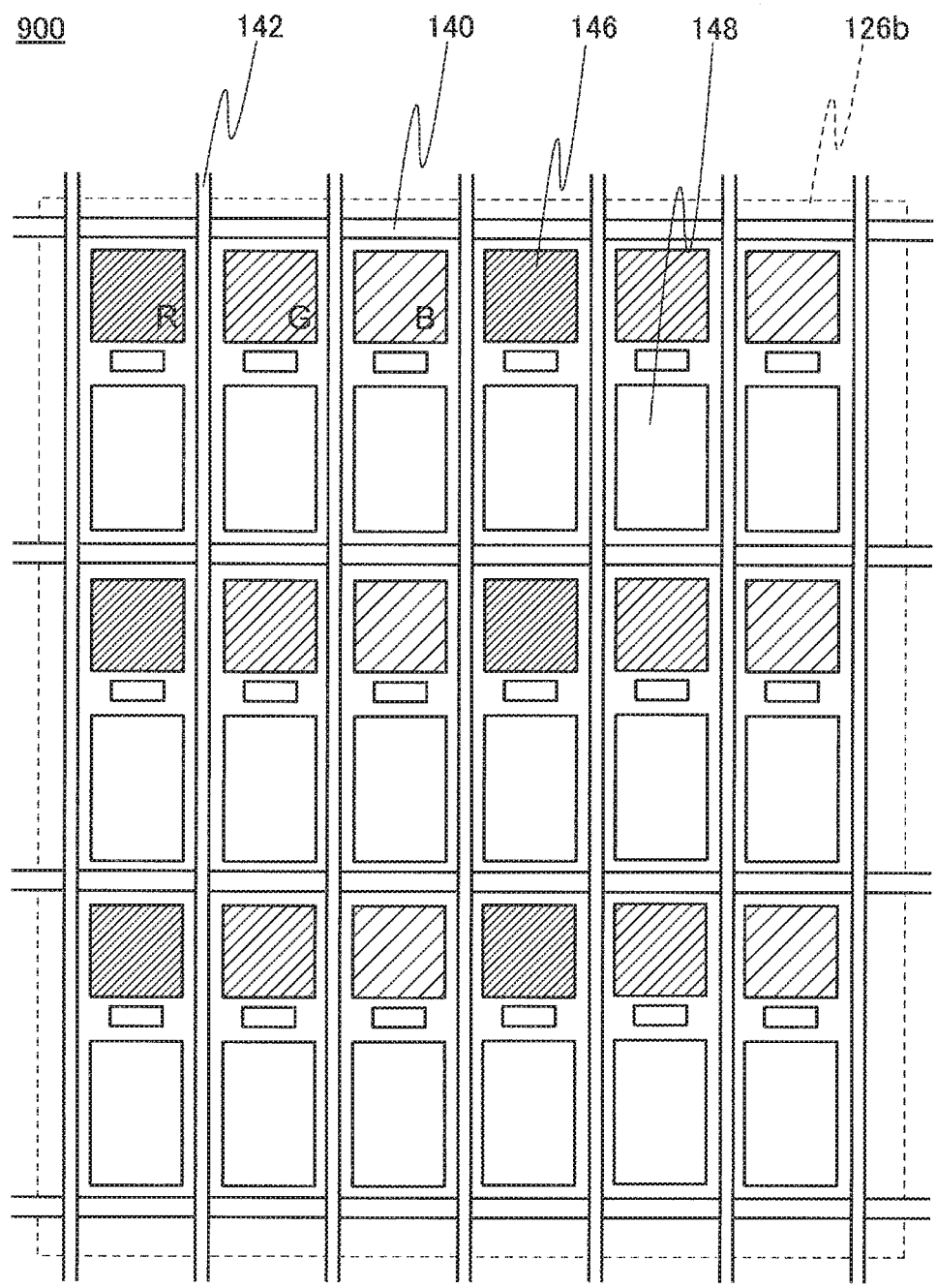
FIG. 16 is a planar view diagram showing a pixel structure of a display device according to one embodiment of the present invention.

Several arrangement examples of a pixel in the display device 900 according to the present embodiment are explained. FIG. 16 is a planar view diagram for explaining an arrangement example of a pixel in the display device 900 according to the present embodiment. In this example, each of a plurality of pixels is formed by three sub-pixels which emit red (R), green (G) and blue (B) light and the plurality of pixels are arranged in a matrix shape. In the present embodiment, one sub-pixel is also called a pixel.

A scanning signal line 140 is arranged in a row direction and a video signal line 142 is arranged in a column direction between pixels arranged in a matrix shape. Furthermore, the upper electrode 126b of the storage capacitor 126 which also provides the function of the power supply voltage line 144 is arranged so as to cover a plurality of pixels. The power supply voltage line 144 is electrically connected to a drain electrode of the drive transistor 124 (not shown in the diagram) which includes each of the plurality of pixels.

In the display devices according to the first to eighth embodiments, the power supply voltage line 144 is arranged in a column direction with respect to a plurality of pixels arranged in a matrix shape. In the display device 900 according to the present embodiment, because a transparent conductive film which covers a plurality of pixels is used as the power supply voltage line 144, it is possible to reduce resistance without reducing an aperture ratio.

Each of the plurality of pixels is arranged with the emission region 146 which emits either red (R), green (G) or blue (B) light and the transparent region 148 which includes transparency.

Pixel Arrangement Example 2

Figure 17:
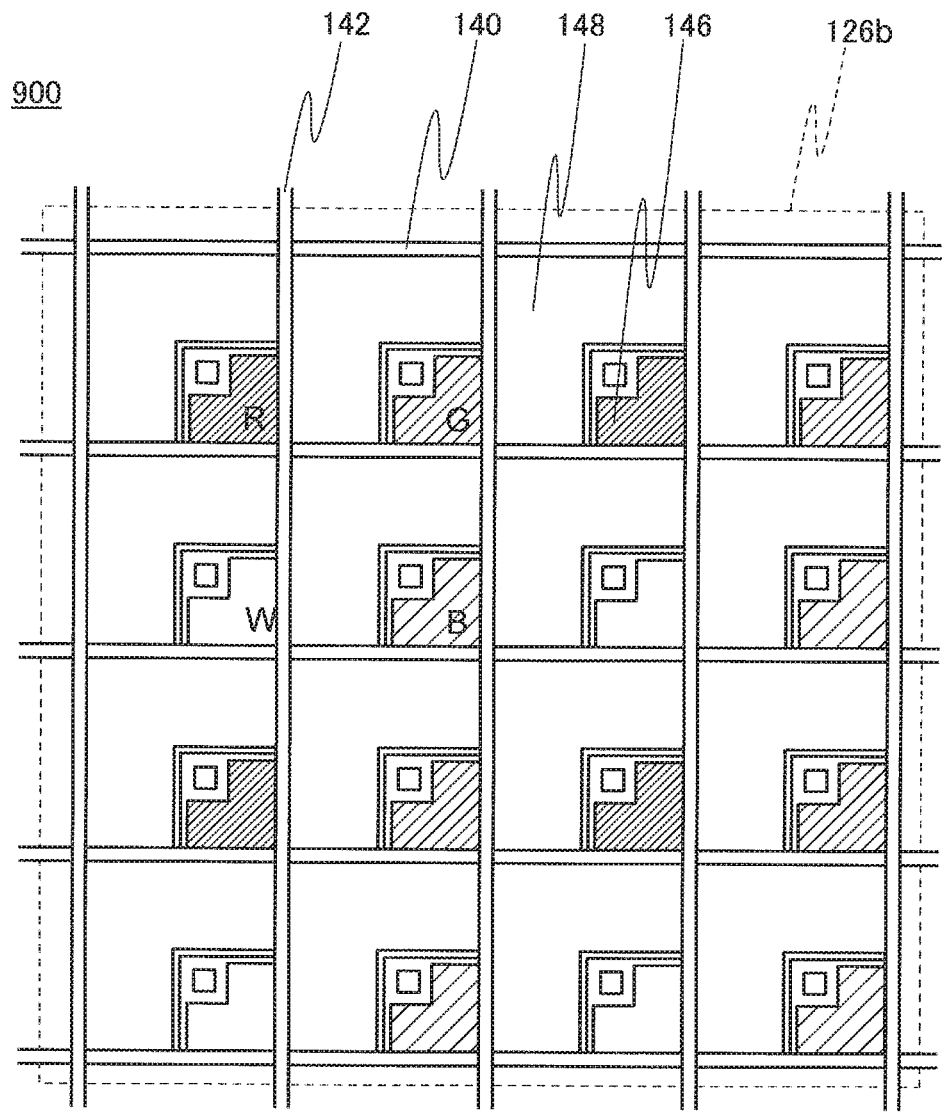
FIG. 17 is a planar view diagram showing a pixel structure of a display device according to one embodiment of the present invention.

FIG. 17 is a planar view diagram for explaining another arrangement example of a pixel in the display device 900 according to the present embodiment. In this example, each of a plurality of pixels is formed by four pixels which emit red (R), green (G), blue (B) light and white (W) light. An example is exemplified in which the area of a transparent region is about 75% of a pixel in each of the plurality of pixels.

Pixel Arrangement Example 3

Figure 18:
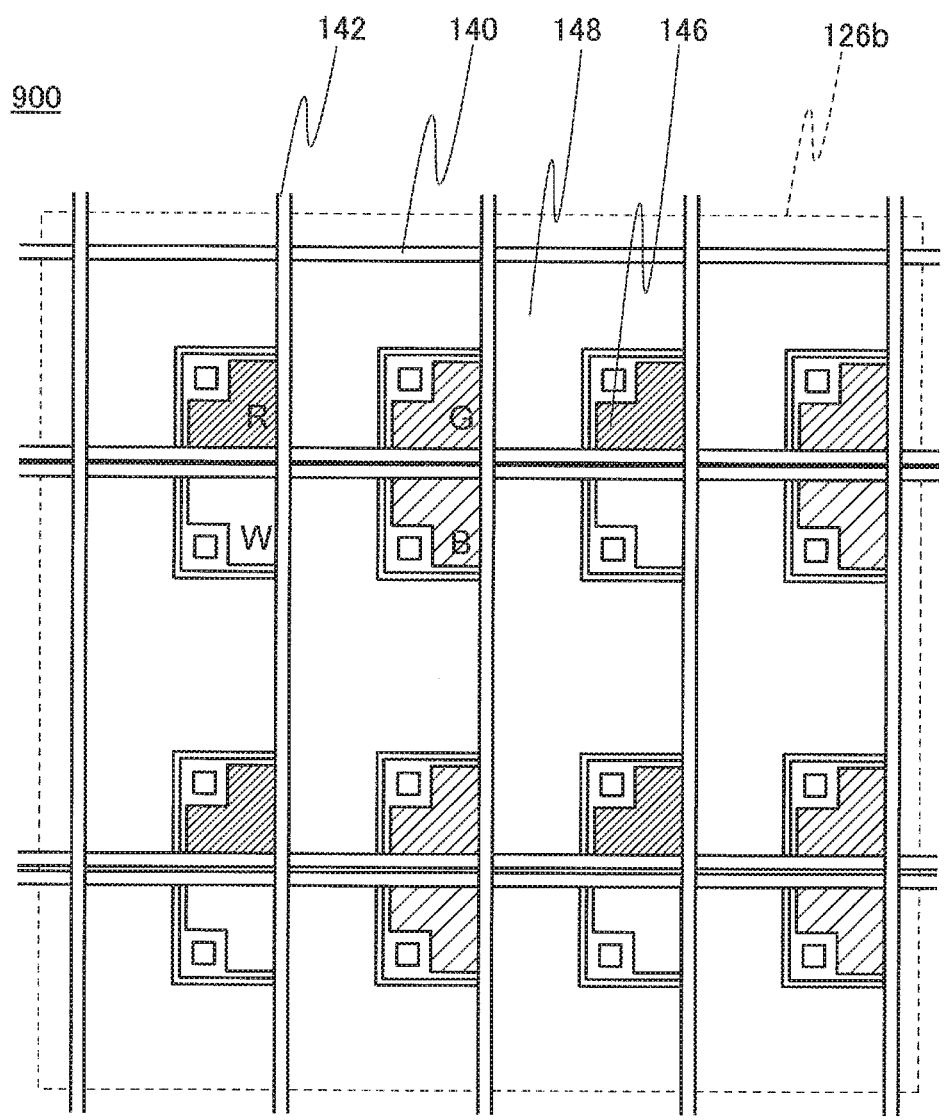
FIG. 18 is a planar view diagram showing a pixel structure of a display device according to one embodiment of the present invention.

FIG. 18 is a planar view diagram for explaining another arrangement example of a pixel in the display device 900 according to the present embodiment. In this example, each of a plurality of pixels is formed by four pixels which emit red (R), green (G), blue (B) light and white (W) light. An example is exemplified in which the area of a transparent region is about 75% of a pixel in each of the plurality of pixels In addition, adjacent rows have a structure in which a scanning signal line 140 is shared. In this way, it is possible to improve an aperture ratio by reducing the number of scanning signal lines 140 by half.

Pixel Arrangement Example 4

Figure 19:
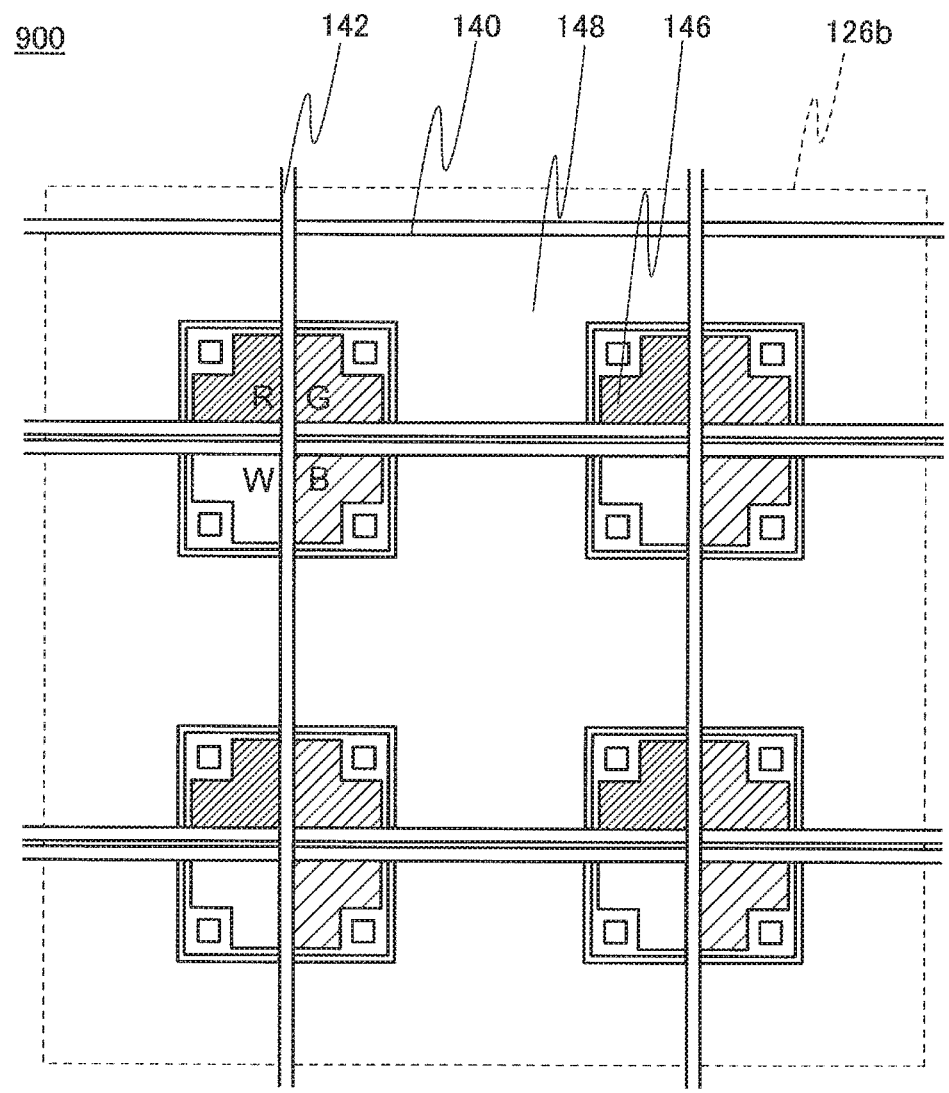
FIG. 19 is a planar view diagram showing a pixel structure of a display device according to one embodiment of the present invention.

FIG. 19 is a planar view diagram for explaining another arrangement example of a pixel in the display device 900 according to the present embodiment. In this example, each of a plurality of pixels is formed by four pixels which emit red (R), green (G), blue (B) light and white (W) light. An example is exemplified in which the area of a transparent region is about 75% of a pixel in each of the plurality of pixels In addition, each adjacent row and column includes a structure in which a scanning signal line 140 and video signal line 142 are shared respectively. In this way, it is possible to further improve an aperture ratio by reducing the number of scanning signal lines 140 and video signal lines 142 by half.

The preferred embodiments of the present invention were explained above using the first to ninth embodiments. However, these embodiments are merely examples and the technical scope of the present invention is not limited to these embodiments. A person ordinarily skilled in the art could make various modifications without departing from the concept of the present invention. Therefore, such modifications should also be interpreted as belonging to the technical scope of the present invention.

The invention claimed is:
1. A display device comprising:
a plurality of pixels arranged in a matrix form, the plurality of pixels each comprising:
an emission region having a light-emitting element; and
a transparent region comprising at least a part of a storage capacitor having transparency,
wherein the light-emitting element includes:
a first electrode covering the plurality of pixels,
a light-emitting layer disposed under the first electrode, and
a second electrode disposed under the light-emitting layer in each of the plurality of pixels, and
wherein the storage capacitor includes the first electrode.
2. The display device according to claim 1,
wherein the light-emitting layer extends to the transparent region, and
wherein the light-emitting layer has an insulation property in the transparent region.
3. The display device according to claim 1,
wherein the second electrode includes a transparent conductive layer, and
wherein the storage capacitor includes a third electrode belonging to the same layer as the transparent conductive layer.
4. The display device according to claim 3, further comprising:
a bank comparting the plurality of pixels,
wherein the bank further comparts each of the plurality of pixels into the emission region and the transparent region, and
wherein the storage capacitor includes an insulating layer which is disposed under the first electrode, covers the transparent region, and extends over the bank.
5. The display device according to claim 3, further comprising
a bank comparting the plurality of pixels, wherein the bank further comparts each of the plurality of pixels into the emission region and the transparent region, and wherein the storage capacitor includes an insulating layer which is disposed under the first electrode, covers the transparent region and extends under the bank.

6. The display device according to claim 1, wherein the storage capacitor includes:

a third electrode covering the plurality of pixels; and a fourth electrode disposed in each of the plurality of pixels.

7. The display device according to claim 6, wherein the third electrode is electrically connected with the first electrode.

8. The display device according to claim 6, wherein the third electrode is electrically connected with a power voltage line supplying a power voltage.

9. The display device according to claim 6, wherein the fourth electrode is divided into a plurality of regions electrically separated from each other in each of the plurality of pixels.

* * * * *